US010795198B2

(12) United States Patent
Liu et al.

(10) Patent No.: US 10,795,198 B2
(45) Date of Patent: Oct. 6, 2020

(54) FEEDBACK CIRCUIT, HEATING CIRCUIT, DISPLAY APPARATUS AND DISPLAY SYSTEM

(71) Applicant: BOE Technology Group Co., Ltd., Beijing (CN)

(72) Inventors: Jianfu Liu, Beijing (CN); Qingyong Li, Beijing (CN); Junbo Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 381 days.

(21) Appl. No.: 15/741,668

(22) PCT Filed: Jul. 7, 2017

(86) PCT No.: PCT/CN2017/092196
§ 371 (c)(1),
(2) Date: Jan. 3, 2018

(87) PCT Pub. No.: WO2018/040744
PCT Pub. Date: Mar. 8, 2018

(65) Prior Publication Data
US 2019/0079337 A1 Mar. 14, 2019

(30) Foreign Application Priority Data

Aug. 30, 2016 (CN) .......................... 2016 1 0770246

(51) Int. Cl.
G02F 1/1333 (2006.01)
G02F 1/133 (2006.01)
(Continued)

(52) U.S. Cl.
CPC ...... G02F 1/133382 (2013.01); G02F 1/1343 (2013.01); G02F 1/13306 (2013.01); G02F 1/136204 (2013.01); H03K 7/08 (2013.01)

(58) Field of Classification Search
CPC .......... G02F 1/133382; G02F 1/13306; G02F 1/1343; G02F 1/136204; H03K 7/08
See application file for complete search history.

(56) References Cited

U.S. PATENT DOCUMENTS

2016/0103358 A1* 4/2016 Tanaka .................. G06F 3/0412
349/12
2017/0077798 A1* 3/2017 Drda ........................ H02M 1/32

FOREIGN PATENT DOCUMENTS

CN 101201904 A 6/2008
CN 102566629 A 7/2012
(Continued)

OTHER PUBLICATIONS

The Second Office Action dated Jul. 17, 2018 corresponding to Chinese application No. 201610770246.6.
(Continued)

Primary Examiner — Nathanael R Briggs
(74) Attorney, Agent, or Firm — Nath, Goldberg & Meyer; Joshua B. Goldberg

(57) ABSTRACT

The present disclosure provides a feedback circuit for monitoring a heating loop, comprising a sample input module, a voltage conversion module and a main control chip. The sample input module has an input terminal coupled to the heating loop and configured to collect a voltage signal from the heating loop, and an output terminal electrically coupled to an input terminal of the voltage conversion module. The voltage conversion module has an output terminal coupled to an input terminal of the main control chip, and is configured to convert the voltage signal received from the sample input module into a voltage signal that the main control chip can withstand. The main control chip is configured to send a sample control signal to the heating loop, and calculate and output magnitude of the voltage signal (Continued)

inputted to the sample input module according to the voltage signal outputted by the voltage conversion module.

16 Claims, 2 Drawing Sheets

(51) Int. Cl.
   *G02F 1/1343* (2006.01)
   *G02F 1/1362* (2006.01)
   *H03K 7/08* (2006.01)

(56) References Cited

FOREIGN PATENT DOCUMENTS

| | | | |
|---|---|---|---|
| CN | 102662266 A | | 9/2012 |
| CN | 103412426 A | | 11/2013 |
| CN | 203673365 U | * | 6/2014 |
| CN | 203673365 U | | 6/2014 |
| CN | 104035428 A | | 9/2014 |
| CN | 104765392 A | | 7/2015 |
| CN | 106226933 A | | 12/2016 |

OTHER PUBLICATIONS

First Office Action dated Nov. 24, 2017 corresponding to Chinese application No. 201610770246.6.
International Search Report dated Sep. 28, 2017 corresponding to application No. PCT/CN2017/092196.

* cited by examiner

FEEDBACK CIRCUIT, HEATING CIRCUIT, DISPLAY APPARATUS AND DISPLAY SYSTEM

CROSS-REFERENCE TO RELATED APPLICATION

This is a National Phase application filed under 35 U.S.C. 371 as a national stage of PCT/CN2017/092196, filed on Jul. 7, 2017, an application claiming the benefit of priority to China Patent Application No. 201610770246.6 filed on Aug. 30, 2016, the contents of which are incorporated herein in their entirety by reference.

TECHNICAL FIELD

The present disclosure relates to the field of display technology, and particularly relates to a feedback circuit, a heating circuit including the feedback circuit, a display apparatus including the heating circuit and a display system including the display apparatus.

BACKGROUND

In order to ensure that a liquid crystal display screen can operate normally under low temperature environment, a heating circuit is generally provided in the liquid crystal display apparatus.

SUMMARY

An object of the present disclosure is to provide a feedback circuit, a heating circuit including the feedback circuit, a display apparatus including the heating circuit and a display system including the display apparatus. With the feedback circuit, whether the heating loop in the liquid crystal display device operates normally or not can be monitored.

In order to achieve the above object, as an aspect of the present disclosure, there is provided a feedback circuit for monitoring a heating loop, comprising a sample input module, a voltage conversion module and a main control chip, wherein, an input terminal of the sample input module is coupled to the heating loop and configured to collect a voltage signal from the heating loop, an output terminal of the sample input module is electrically coupled to an input terminal of the voltage conversion module, an output terminal of the voltage conversion module is coupled to an input terminal of the main control chip, the voltage conversion module is configured to convert the voltage signal received from the sample input module into a voltage signal that the main control chip is able to withstand, and the main control chip is configured to send a sample control signal to the heating loop, and calculate and output a magnitude of the voltage signal inputted to the sample input module according to the voltage signal outputted by the voltage conversion module.

Optionally, the voltage conversion module comprises a voltage-regulator tube, an optocoupler and a filter module, which are connected in series; the sample input module comprises a first output terminal coupled to an input terminal of the voltage-regulator tube and a second output terminal coupled to an anode terminal of the optocoupler, the voltage-regulator tube has an output terminal coupled to a cathode terminal of the optocoupler, the optocoupler has an emitting electrode formed as an output terminal of the optocoupler and a collecting electrode coupled to a pull-up signal input terminal, and the filter module has an input terminal connected to the pull-up signal input terminal, a first output terminal coupled to a ground terminal of the optocoupler and a second output terminal coupled to the emitting electrode of the optocoupler.

Optionally, the voltage-regulator tube is configured to lower the voltage signal collected by the sample input module to a range that the optocoupler is able to withstand, and the optocoupler is configured to further lower a voltage signal outputted by the voltage-regulator tube to a range that the main control chip is able to withstand.

Optionally, the voltage-regulator tube is configured to lower the voltage signal outputted by the sample input module to a voltage signal of 12V, and the optocoupler is configured to lower the voltage signal of 12V to a voltage signal of 3.3V.

Optionally, the sample input module comprises a first sample resistor, a second sample resistor, a third sample resistor, a fourth sample resistor and a fifth sample resistor, the second sample resistor and the third sample resistor are connected in parallel to form a resistor assembly, one terminal of the first sample resistor is formed as the input terminal of the sample input module, the other terminal of the first sample resistor is coupled to one terminal of the resistor assembly, the other terminal of the resistor assembly is coupled to one terminal of the fourth sample resistor, the other terminal of the fourth sample resistor is coupled to one terminal of the fifth sample resistor, and the other terminal of the fifth sample resistor is coupled to the anode terminal of the optocoupler.

Optionally, the filter module comprises a filter capacitor and a pull-up resistor, the filter capacitor has a first terminal coupled to the pull-up signal input terminal, and a second terminal formed as the first output terminal of the filter module, and the pull-up resistor has a first terminal formed as the input terminal of the filter module, and a second terminal formed as the second output terminal of the filter module.

Optionally, the feedback circuit further comprises an alarm module, and the main control chip is further configured to send, to the alarm module, a signal for controlling the alarm module to generate alarm information when the sample input module does not output a sample signal.

Optionally, the sample input module is configured to collect the voltage signal outputted by the heating loop and used for heating a liquid crystal display panel.

Optionally, the sample control signal outputted by the main control chip is a PWM signal.

As another aspect of the present disclosure, there is provided a heating circuit, comprising a heating loop and the above feedback circuit provided by the present disclosure, wherein the input terminal of the sample input module is coupled to a positive output terminal of the heating loop, the voltage conversion module is coupled to a negative output terminal of the heating loop, and an output terminal of the main control chip is coupled to a PWM signal input terminal of the heating loop.

Optionally, the heating loop is configured to output a heating signal having a same duty circle as the sample control signal according to the sample control signal received from the main control chip.

As still another aspect of the present disclosure, there is provided a display apparatus, comprising a heating circuit, wherein the heating circuit is the above heating circuit provided by the present disclosure, the display apparatus comprises a display panel and a heating resistor provided on the back of the display panel, and the heating resistor is connected in series between the positive output terminal and the negative output terminal of the heating loop.

As still another aspect of the present disclosure, there is provided a display system, comprising an upper computer and a display apparatus, wherein the display apparatus is the above display apparatus provided by the present disclosure, and the upper computer is configured to receive a signal sent from the main control chip, as a voltage signal inputted to the sample input module.

In the present disclosure, an output voltage of the heating loop is sampled by using the sample input module, the sampled voltage is then converted by the voltage conversion device into a voltage that the main control chip module can withstand, and the main control chip derives a voltage value of the voltage signal outputted by the heating loop according to the voltage inputted to the main control chip. When there is no output from the heating loop, the main control chip will receive no sample signal accordingly.

BRIEF DESCRIPTION OF THE DRAWINGS

The accompanying drawings, which serve to provide a further understanding of the present disclosure and constitute a part of this specification, are used for explaining the present disclosure together with the following specific implementations, rather than limiting the present disclosure. In the drawings.

DETAILED DESCRIPTION

Specific implementations of the present disclosure will be further described in detail below in conjunction with the accompanying drawings. It should be understood that, the specific implementations described herein are merely used for describing and explaining the present disclosure, rather than limiting the present disclosure.

Inventors found that, at present, it still cannot be determined properly whether the heating circuit in the liquid crystal display apparatus operates normally or not.

Figure 1:
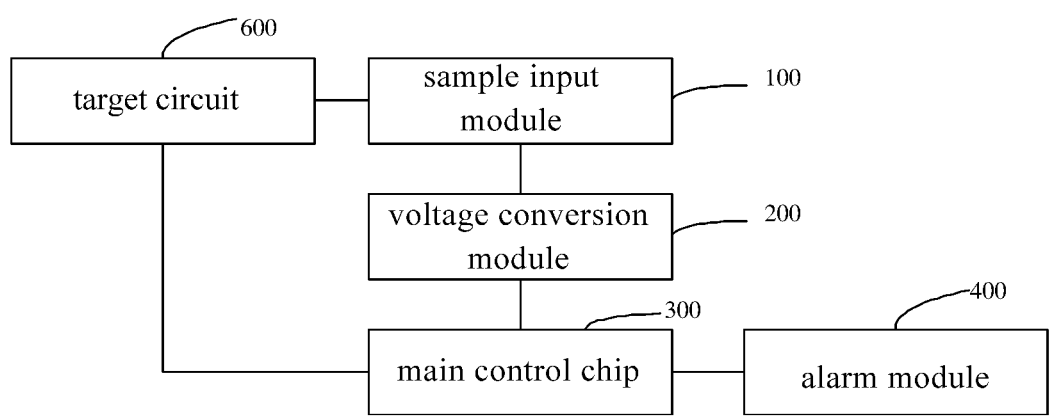
FIG. 1 is a schematic block diagram of a feedback circuit provided in the present disclosure.

Thus, the present disclosure provides a feedback circuit, as shown in FIG. 1, including a sample input module 100, a voltage conversion module 200 and a main control chip 300. An input terminal of the sample input module 100 is coupled to a target circuit 600 and configured to collect a voltage signal from the target circuit 600, an output terminal of the sample input module 100 is electrically coupled to an input terminal of the voltage conversion module 200, an output terminal of the voltage conversion module 200 is coupled to an input terminal of the main control chip 300, the voltage conversion module 200 is configured to convert the voltage signal received from the sample input module 100 into a voltage signal that the main control chip 300 can withstand, and the main control chip 300 is configured to send a sample control signal to the target circuit, and calculate and output a magnitude of the voltage signal inputted to the sample input module 100 according to the voltage signal output by the voltage conversion module 200.

Figure 3:
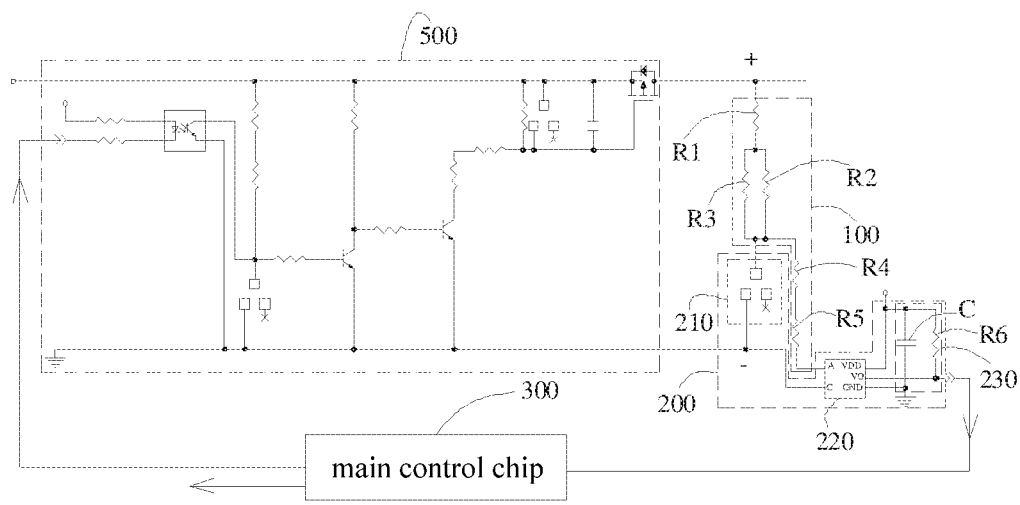
FIG. 3 is a circuit diagram of a heating circuit provided in the present disclosure.

It can be easily understood that, the feedback circuit provided by the present disclosure is applicable to a heating circuit of a liquid crystal display apparatus. FIG. 3 illustrates a circuit diagram of a heating circuit provided by the present disclosure. As shown in FIG. 3, the heating circuit of the liquid crystal display apparatus may include a heating loop 500 and the above feedback circuit. Here, the above-described "target circuit" refers to the heating loop 500. The sample input module 100 is configured to collect a voltage signal outputted by the heating loop 500 and used for heating a liquid crystal display panel. The voltage signal is applied to a heating resistor provided on the back of the liquid crystal display panel, and the liquid crystal display panel can be heated using heat generated by the resistor.

When the feedback circuit operates, the main control chip 300 outputs a sample control signal, which is a PWM signal, and thus, the main control chip 300 is coupled to a PWM signal input terminal of the heating loop 500 in the heating circuit. Upon receipt of the sample control signal outputted from the main control chip 300, the heating loop 500 can output a heating signal (i.e., a voltage signal for heating the liquid crystal display panel) having a same duty circle with the sample control signal. In this case, however, the heating signal outputted by the heating loop 500 has an amplitude up to tens of volts to achieve the heating function. Because a main control chip that is commercially available has an operating voltage of merely several volts, the main control chip cannot be directly used to measure the output of the heating loop 500. In the embodiments of the present disclosure, the sample input module 100 may be used to sample the output voltage of the heating loop 500, then the voltage conversion device 200 may be used to convert the collected voltage into a voltage that the main control chip 300 can withstand, and the main control chip 300 can derive the magnitude of the voltage signal outputted by the heating loop 500 (i.e., the magnitude of the voltage signal inputted to the sample input module 100) according to the voltage inputted to the main control chip 300.

When there is no output from the heating loop 500, the main control chip 300 will not receive any sample signal accordingly.

Therefore, with the feedback circuit provided by the present disclosure, operating condition of the heating loop can be monitored in real time, and fed back to an end-user in real time.

Figure 2:
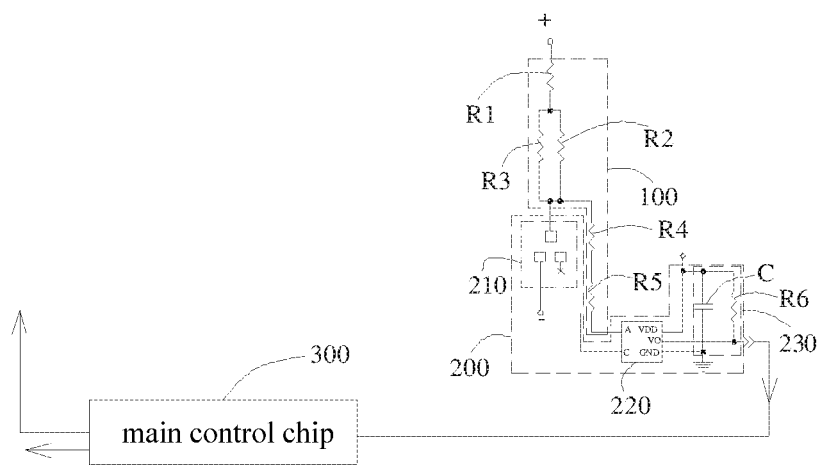
FIG. 2 is a circuit diagram of a feedback circuit provided in the present disclosure.

In the present disclosure, the specific structure of the voltage conversion module 200 is not particularly limited. Optionally, as shown in FIG. 2, the voltage conversion module 200 may include a voltage-regulator tube 210, an optocoupler 220 and a filter module 230, which are connected in series; the sample input module 100 includes a first output terminal coupled to an input terminal of the voltage-regulator tube 210 and a second output terminal coupled to an anode terminal A of the optocoupler 220, an output terminal of the voltage-regulator tube 210 is coupled to a cathode terminal C of the optocoupler 220, and the optocoupler 220 also has an emitting electrode VO formed as the output terminal of the optocoupler 220 and a collecting electrode VDD coupled to a pull-up signal input terminal.

The voltage-regulator tube 210 is configured to lower the voltage signal collected by the sample input module 100 to a range that the optocoupler 220 can withstand, and the optocoupler 220 is configured to further lower the voltage signal outputted by the voltage-regulator tube 210 to a range that the main control chip 100 can withstand.

In the embodiments of the present disclosure, the voltage-regulator tube 210 may be a voltage-regulator tube of 12V, which can lower the voltage signal collected by the sample input module 100 from the heating loop 500 to a safety voltage of 12V. In the embodiments of the present disclosure, the optocoupler 220 may be ACPL-M61L, which can lower a voltage signal of 12V to a voltage signal of 3.3V.

With the filter module 230, the influence of noise in the circuit on the optocoupler 220 can be eliminated, so that the optocoupler 220 can output a stable signal to the main control chip 300 and further, the accuracy of the feedback circuit is improved.

In the present disclosure, the specific structure of the sample input module 100 is not particularly limited, as long as the sample input module 100 can collect the voltage signal outputted by the heating loop 500. In some embodiments of the present disclosure, the sample input module 100 may include a first sample resistor R1, a second sample resistor R2, a third sample resistor R3, a fourth sample resistor R4 and a fifth sample resistor R5. The second sample resistor R2 and the third sample resistor R3 are connected in parallel to form a resistor assembly, one terminal of the first sample resistor R1 is formed as the input terminal of the sample input module 100, the other terminal of the first sample resistor R1 is coupled to one terminal of the resistor assembly, the other terminal of the resistor assembly is coupled to one terminal of the fourth sample resistor R4, the other terminal of the fourth sample resistor R4 is coupled to one terminal of the fifth sample resistor R5, and the other terminal of the fifth sample resistor R5 is coupled to the anode terminal A of the optocoupler 220.

The first sample resistor R1, the second sample resistor R2, the third sample resistor R3, the fourth sample resistor R4 and the fifth sample resistor R5 all have a current limiting function and can prevent a too large current generated by the heating loop from flowing into the optocoupler 220, thus protecting the optocoupler 220.

Optionally, the filter module 230 includes a filter capacitor C and a pull-up resistor R6, the filter capacitor C has a first terminal coupled to the pull-up signal input terminal, and a second terminal formed as a first output terminal of the filter module 230 and coupled to a ground terminal of the optocoupler 220, and the pull-up resistor R6 has a first terminal formed as the input terminal of the filter module 230 and coupled to the pull-up signal input terminal, and a second terminal formed as a second output terminal of the filter module 230 and coupled to the emitting electrode of the optocoupler.

Optionally, the feedback circuit further includes an alarm module 400, and in the case where the sample input module 100 does not output a sample signal, the main control chip 300 can send, to the alarm module 400, a signal for controlling the alarm module 400 to generate alarm information.

When the main control chip 300 does not receive an electrical signal collected from the heating loop 500, it indicates that there may be a fault in the heating loop 500. Thus, when the main control chip 300 controls the alarm module 400 to generate the alarm information, monitoring staff may be informed that there may be a fault in the heating loop, and can repair the heating loop promptly.

As another aspect of the present disclosure, there is provided a heating circuit, as shown in FIG. 3, including a heating loop 500 and the above feedback circuit provided by the present disclosure. The input terminal of the sample input module 100 is coupled to a positive output terminal of the heating loop 500, and the voltage conversion module 200 is coupled to a negative output terminal of the heating loop 500. The output terminal of the main control chip 300 is coupled to the PWM signal input terminal of the heating loop 500, and a voltage value outputted by the heating loop 500 is controlled by adjusting the duty circle of the PWM signal. As shown in FIG. 3, the heating loop 500 includes an optocoupler component whose cathode serves as the PWM signal input terminal.

As another aspect of the present disclosure, there is further provided a display apparatus including a heating circuit, wherein the heating circuit is the above heating circuit provided by the present disclosure, the display apparatus includes a display panel and a heating resistor provided on the back of the display panel, and the heating resistor is connected in series between the positive output terminal and the negative output terminal of the heating loop.

In operation, the heating circuit may output a voltage signal to the heating resistor, so that the heating resistor generates heat to heat the liquid crystal material in the display panel.

As still another aspect of the present disclosure, there is provided a display system including an upper computer and a display apparatus, wherein the display apparatus is the above display apparatus provided by the present disclosure, and the upper computer is configured to receive a signal sent from the main control chip, as a voltage signal inputted to the sample input module.

The upper computer may determine whether the heating loop operates normally or not according to a signal sent from the main control chip.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A feedback circuit for monitoring a heating loop, comprising a sample input module, a voltage conversion module and a main control chip, wherein an input terminal of the sample input module is coupled to the heating loop and configured to collect a voltage signal from the heating loop, an output terminal of the sample input module is electrically coupled to an input terminal of the voltage conversion module, an output terminal of the voltage conversion module is coupled to an input terminal of the main control chip, the voltage conversion module is configured to convert the voltage signal received from the sample input module into a voltage signal that the main control chip is able to withstand, and the main control chip is configured to send a sample control signal to the heating loop, and calculate and output a magnitude of the voltage signal inputted to the sample input module according to the voltage signal outputted by the voltage conversion module, wherein the voltage conversion module comprises a voltage-regulator tube, an optocoupler and a filter module, which are connected in series; the sample input module comprises a first output terminal coupled to an input terminal of the voltage-regulator tube and a second output terminal coupled to an anode terminal of the optocoupler, the voltage-regulator tube has an output terminal coupled to a cathode terminal of the optocoupler, the optocoupler has an emitting electrode formed as an output terminal of the optocoupler and a collecting electrode coupled to a pull-up signal input terminal, and the filter module has an input terminal connected to the pull-up signal input terminal, a first output terminal coupled to a round terminal of the optocoupler and a second output terminal coupled to the emitting electrode of the optocoupler, and the voltage-regulator tube is configured to lower the voltage signal collected by the sample input module to a range that the optocoupler is able to withstand, and the optocoupler is configured to further lower a voltage signal outputted by the voltage-regulator tube to a range that the main control chip is able to withstand.

2. The feedback circuit of claim 1, wherein the voltage-regulator tube is configured to lower the voltage signal outputted by the sample input module to a voltage signal of 12V, and the optocoupler is configured to lower the voltage signal of 12V to a voltage signal of 3.3V.

3. The feedback circuit of claim 1, wherein the sample input module comprises a first sample resistor, a second sample resistor, a third sample resistor, a fourth sample resistor and a fifth sample resistor, the second sample resistor and the third sample resistor are connected in parallel to form a resistor assembly, one terminal of the first sample resistor is formed as the input terminal of the sample input module, the other terminal of the first sample resistor is coupled to one terminal of the resistor assembly, the other terminal of the resistor assembly is coupled to one terminal of the fourth sample resistor, the other terminal of the fourth sample resistor is coupled to one terminal of the fifth sample resistor, and the other terminal of the fifth sample resistor is coupled to the anode terminal of the optocoupler.

4. The feedback circuit of claim 1, wherein the filter module comprises a filter capacitor and a pull-up resistor, the filter capacitor has a first terminal coupled to the pull-up signal input terminal, and a second terminal formed as the first output terminal of the filter module, and the pull-up resistor has a first terminal formed as the input terminal of the filter module, and a second terminal formed as the second output terminal of the filter module.

5. The feedback circuit of claim 1, further comprising an alarm module, wherein the main control chip is further configured to send, to the alarm module, a signal for controlling the alarm module to generate alarm information when the sample input module does not output a sample signal.

6. The feedback circuit of claim 1, wherein the sample input module is configured to collect the voltage signal outputted by the heating loop and used for heating a liquid crystal display panel.

7. The feedback circuit of claim 1, wherein the sample control signal outputted by the main control chip is a PWM signal.

8. A heating circuit, comprising a heating loop and the feedback circuit of claim 1, wherein the input terminal of the sample input module is coupled to a positive output terminal of the heating loop, the voltage conversion module is coupled to a negative output terminal of the heating loop, and an output terminal of the main control chip is coupled to a PWM signal input terminal of the heating loop.

9. The heating circuit of claim 8, wherein the heating loop is configured to output, according to the sample control signal received from the main control chip, a heating signal having a same duty circle as the sample control signal.

10. The heating circuit of claim 8, wherein the voltage-regulator tube is configured to lower the voltage signal outputted by the sample input module to a voltage signal of 12V, and the optocoupler is configured to lower the voltage signal of 12V to a voltage signal of 3.3V.

11. The heating circuit of claim 8, wherein the sample input module comprises a first sample resistor, a second sample resistor, a third sample resistor, a fourth sample resistor and a fifth sample resistor, the second sample resistor and the third sample resistor are connected in parallel to form a resistor assembly, one terminal of the first sample resistor is formed as the input terminal of the sample input module, the other terminal of the first sample resistor is coupled to one terminal of the resistor assembly, the other terminal of the resistor assembly is coupled to one terminal of the fourth sample resistor, the other terminal of the fourth sample resistor is coupled to one terminal of the fifth sample resistor, and the other terminal of the fifth sample resistor is coupled to the anode terminal of the optocoupler.

12. The heating circuit of claim 8, wherein the filter module comprises a filter capacitor and a pull-up resistor, the filter capacitor has a first terminal coupled to the pull-up signal input terminal, and a second terminal formed as the first output terminal of the filter module, and the pull-up resistor has a first terminal formed as the input terminal of the filter module, and a second terminal formed as the second output terminal of the filter module.

13. The heating circuit of claim 8, wherein the feedback circuit further comprises an alarm module, wherein the main control chip is further configured to send, to the alarm module, a signal for controlling the alarm module to generate alarm information when the sample input module does not output a sample signal.

14. The heating circuit of claim 8, wherein the sample input module is configured to collect the voltage signal outputted by the heating loop and used for heating a liquid crystal display panel.

15. A display apparatus, comprising a heating circuit, wherein the heating circuit is the heating circuit of claim 9, the display apparatus comprises a display panel and a heating resistor provided on the back of the display panel, and the heating resistor is connected in series between the positive output terminal and the negative output terminal of the heating loop.

16. A display system, comprising an upper computer and a display apparatus, wherein the display apparatus is the display apparatus of claim 15, and the upper computer is configured to receive a signal sent from the main control chip, as a voltage signal inputted to the sample input module.

* * * * *